US012203962B2

(12) United States Patent
Sato et al.

(10) Patent No.: US 12,203,962 B2
(45) Date of Patent: Jan. 21, 2025

(54) ELECTRICAL CURRENT MEASUREMENT SYSTEM, AND DIAGNOSTIC SYSTEM

(71) Applicant: Panasonic Intellectual Property Management Co., Ltd., Osaka (JP)

(72) Inventors: Yuta Sato, Osaka (JP); Hirohide Ichihashi, Osaka (JP); Kazutaka Ikeda, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 258 days.

(21) Appl. No.: 17/442,560

(22) PCT Filed: Feb. 25, 2020

(86) PCT No.: PCT/JP2020/007297
§ 371 (c)(1),
(2) Date: Sep. 23, 2021

(87) PCT Pub. No.: WO2020/261639
PCT Pub. Date: Dec. 30, 2020

(65) Prior Publication Data
US 2022/0308093 A1   Sep. 29, 2022

(30) Foreign Application Priority Data
Jun. 27, 2019  (JP) .................................. 2019-120590

(51) Int. Cl.
*G01R 15/18*  (2006.01)
*G01R 1/20*  (2006.01)
(Continued)

(52) U.S. Cl.
CPC ............. *G01R 15/18* (2013.01); *G01R 1/203* (2013.01); *G01R 19/0092* (2013.01); *G01R 19/2509* (2013.01); *H01F 38/30* (2013.01)

(58) Field of Classification Search
CPC .... G01R 19/0092; G01R 1/203; G01R 15/18; G01R 19/2509; H01F 38/28
(Continued)

(56) References Cited

U.S. PATENT DOCUMENTS 4,209,741 A * 6/1980 Coby .................... G01R 27/20
361/42
6,614,218 B1 * 9/2003 Ray ...................... G01R 15/181
324/117 R
(Continued)

FOREIGN PATENT DOCUMENTS

CN   201229849 Y   4/2009
JP   10-185962 A   7/1998
(Continued)

OTHER PUBLICATIONS

International Search Report of PCT application No. PCT/JP2020/007297 dated Jun. 2, 2020.
English Translation of Chinese Search Report dated Sep. 18, 2023 for the related Chinese Patent Application No. 202080038501.2.

*Primary Examiner* — Farhana A Hoque
(74) *Attorney, Agent, or Firm* — Rimon P.C.

(57) ABSTRACT

A current measurement system is configured to measure an alternating-current (AC) current flowing through a conductor. The AC current has a frequency within a measurement range. The system includes a current sensor and a shunt resistor. The current sensor includes a measurement coil configured to be magnetically coupled to the conductor. The shunt resistor has both ends electrically connected to both ends of the measurement coil, respectively. An output voltage across the both ends of the shunt resistor is saturated at a saturation point in a saturation frequency of the frequency of the AC current. An upper limit value of the measurement range including the frequency is higher than a fundamental frequency of the AC current. The saturation frequency is higher than or equal to the upper limit value. The current (Continued)

measurement system improves sensitivity to frequency components higher than the fundamental frequency of the AC current.

16 Claims, 9 Drawing Sheets

(51) Int. Cl.
*G01R 19/00* (2006.01)
*G01R 19/25* (2006.01)
*H01F 38/30* (2006.01)

(58) Field of Classification Search
USPC .......................................................... 324/126
See application file for complete search history.

(56) References Cited

U.S. PATENT DOCUMENTS

| | | | | |
|---|---|---|---|---|
| 2009/0096471 | A1* | 4/2009 | Eden | G01N 17/04 |
| | | | | 324/700 |
| 2015/0028163 | A1* | 1/2015 | Hochman | B61L 27/53 |
| | | | | 246/194 |
| 2015/0276816 | A1* | 10/2015 | Yoshida | G01R 19/0092 |
| | | | | 324/244 |
| 2019/0324075 | A1* | 10/2019 | Kinsella | G01R 15/183 |

FOREIGN PATENT DOCUMENTS

| | | |
|---|---|---|
| JP | 2002-311061 A | 10/2002 |
| JP | 2012-068191 | 4/2012 |

* cited by examiner

ELECTRICAL CURRENT MEASUREMENT SYSTEM, AND DIAGNOSTIC SYSTEM

CROSS-REFERENCE TO RELATED APPLICATIONS

This application is a U.S. national stage application of the PCT international application No. PCT/JP2020/007297 filed on Feb. 25, 2020, which claims the benefit of foreign priority of Japanese patent application No. 2019-120590 filed on Jun. 27, 2019, the contents all of which are incorporated herein by reference.

TECHNICAL FIELD

The present disclosure relates to a current measurement system for measuring an AC current, and to a diagnostic system including the current measurement system.

BACKGROUND ART

PTL 1 discloses a current measurement device (current measurement system). The current measurement system of PTL 1 includes a current sensor. The current sensor includes a detection coil wound around a magnetic core arranged annularly around a conductor to be measured. A shunt resistor is connected across a hot-side output terminal and a ground-side output terminal of the detection coil.

CITATION LIST

Patent Literature

PTL 1: Japanese Patent Laid-Open Publication No. 2012-68191

SUMMARY

A current measurement system is configured to measure an alternating-current (AC) current flowing through a conductor. The AC current has a frequency within a measurement range. The current measurement system includes a current sensor and a shunt resistor. The current sensor includes a measurement coil configured to be magnetically coupled to the conductor. The shunt resistor has both ends electrically connected to both ends of the measurement coil, respectively. An output voltage across the both ends of the shunt resistor is saturated at a saturation point in a saturation frequency of the frequency of the AC current. An upper limit value of the measurement range including the frequency is higher than a fundamental frequency of the AC current. The saturation frequency is higher than or equal to the upper limit value.

The current measurement system improves sensitivity to frequency components higher than the fundamental frequency of the AC current.

DESCRIPTION OF EMBODIMENTS

1 Exemplary Embodiment

1.1 Summary

Figure 1:
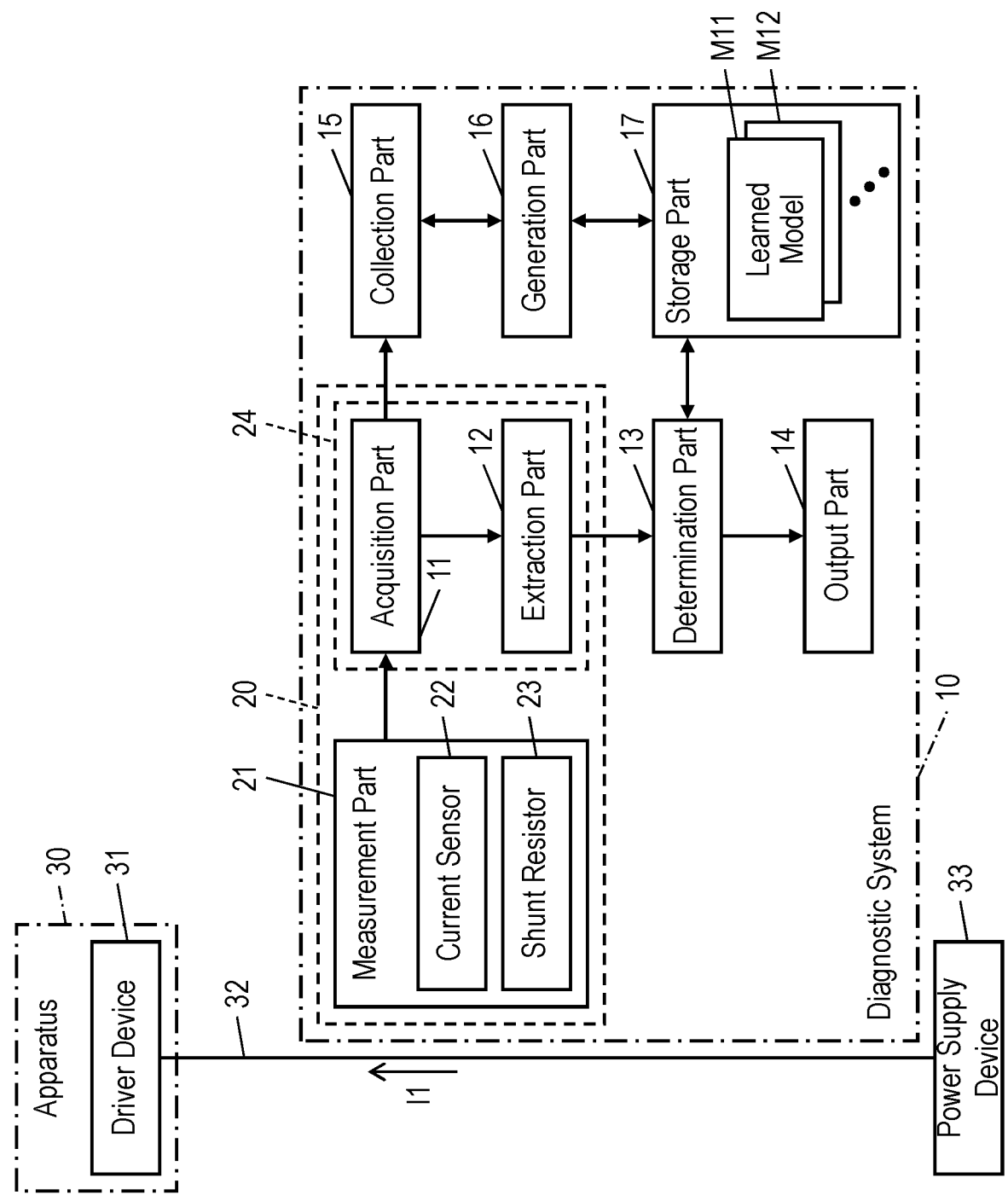
FIG. 1 is a block diagram of a diagnostic system including a current measurement system in accordance with an exemplary embodiment.
Figure 2:
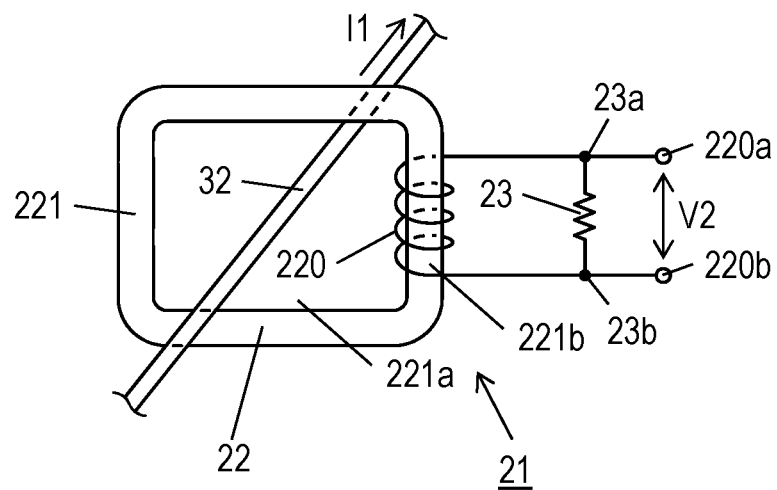
FIG. 2 is a circuit diagram of a measurement part of the current measurement system in accordance with the embodiment.

FIG. 1 shows diagnostic system 10 including current measurement system 20 in accordance with an exemplary embodiment. FIG. 2 is a circuit diagram of the current measurement system. Current measurement system 20 is configured to measure alternating-current (AC) current I1 flowing through conductor 32. As shown in FIG. 2, current measurement system 20 includes current sensor 22 that has measurement coil 220 magnetically coupled to conductor 32, and shunt resistor 23. Current sensor 22 includes measurement coil 220 magnetically coupled to conductor 32. Shunt resistor 23 is electrically connected between both ends 220a and 220b of measurement coil 220. Shunt resistor 23 is connected to both ends 220a and 220b of measurement coil 220 in parallel to measurement coil 220. Current measurement system 20 has a saturation point at which output voltage V2 across the both ends of shunt resistor 23 is saturated at a saturation frequency with respect to a frequency of AC current I1. An upper limit value of a measurement range of the frequency of AC current I1 is higher than a fundamental frequency of AC current I1. The saturation frequency is higher than or equal to the upper limit value of the measurement range.

In current measurement system 20, an induction current induced y AC current I1 flows in measurement coil 220, so that output voltage V2 across both ends 23a and 23b of shunt resistor 23 depends on the induction current. In a frequency range lower than the saturation frequency at the saturation point, output voltage V2 increases as the frequency increases. In current measurement system 20, the saturation frequency is higher than the fundamental frequency of AC current I1, and higher than or equal to the upper limit value of the measurement range. Current measurement system 20 in accordance with the embodiment improves sensitivity to frequency components of AC current I1 higher than the fundamental frequency of AC current I1.

1.2 Details

Diagnostic system 10 including current measurement system 20 in accordance with the embodiment will be detailed below. Diagnostic system 10 is configured to diagnose apparatus 30. Apparatus 30 to be diagnosed by diagnostic system 10 is a work apparatus. The work apparatus is configure to perform a predetermined work, such as processing, conveyance, arrangement, and mounting of material and goods. The processing includes physical processing, such as boring, drilling, tapping, cutting, and polishing. The processing includes chemical processing, such as heating and cooling. Further, the conveyance is not limited to conveyance of solid goods, such as a component and a product, but may include conveyance of fluid in a fluid channel. As such work apparatus, machine tools, such as a lathe, a machining center, an end mill, a grinder, and a drill are provided. Additionally, a component mounting machine, a conveyer, thermal treatment apparatus, a pump (e.g., vacuum pump), a compressor, a polishing machine (e.g., chemical mechanical polishing machine), and the combination thereof are also provided.

1.2.1 Apparatus

Apparatus 30 has a function of, e.g. a lathe. Apparatus 30 may have a function of a machining center. Apparatus 30 includes driver device 31 and power supply device 33.

Driver device 31 is configured to drive a mechanical part. In other words, driver device 31 is a power source of the mechanical part. Driver device 31 includes a motor. An output of the motor depends on a current supplied thereto. The mechanical part is configured to perform a predetermined work. The predetermined work is for processing a workpiece by rotating one of a cutting tool and a workpiece with respect to the other thereof. In other words, apparatus 30 is configured to process the workpiece to obtain a member with a predetermined shape. In accordance with the embodiment, the mechanical part rotates the workpiece with respect to the cutting tool to process the workpiece. In other words, apparatus 30 has a function of a lathe. The cutting tool is configured to process the workpiece. The cutting tool is replaceable. The workpiece is made of, e.g. metal.

The motor is used for holding the cutting tool at a predetermined position with respect to the workpiece in a direction along a central axis about which the workpiece rotates. In driver device 31, the motor allows one of the cutting tool and the workpiece to be pressed against the other thereof in a direction along a central axis about which the one of the cutting tool and the workpiece rotates with respect to the other thereof. In according to the embodiment, an axial direction about which an output shaft of a rotor of the motor rotates extends along the central axis about which the one of the cutting tool and the workpiece rotates with respect to the other thereof, but not limited to this.

The motor is an AC motor powered by an AC current. The AC motor may be a three-phase AC motor or a single-phase AC motor. Specifically, an output of the motor, i.e., the rotational speed, serving as the number of rotations per unit time, is changed according to a change of a fundamental frequency of the AC current supplied to the motor. When the fundamental frequency increases, the output increases, i.e., the output shaft rotates faster. When the fundamental frequency decreases, the output decreases, i.e., the output shaft rotates more slowly.

Power supply device 33 supplies AC current I1 to the motor of driver device 31. In order to cause the mechanical part to perform the predetermined work, power supply device 33 supplies AC current I1 to the motor of driver device 31. In other words, driver device 31 of apparatus 30 receives AC current I1 while performing the predetermined work. Power supply device 33 is connected to the motor via conductor 32, a conductive wire. In accordance with the embodiment, AC current I1 has a fundamental frequency. Power supply device 33 has a function of adjusting the fundamental frequency of AC current I1. Power supply device 33 may be implemented by a well-known AC power supply circuit, hence omitting the detail description thereof.

1.2.2 Diagnostic System

Diagnostic system 10 determines a condition of a cutting tool as a condition of apparatus 30. The condition of the cutting tool is roughly qualified as two conditions, i.e., the presence or absence of damage. When the cutting tool has no damage, diagnostic system 10 determines that the condition of apparatus 30 is normal. As an example, the damage of the cutting tool includes flank-face wear (frank wear), rake-face wear (crater wear), chipping, defect, plastic deformation, built edge (welding), heat crack (thermal crack), boundary wear, and flaking. The wear of the cutting tool occurs similarly if apparatus 30 is the same. However, a defect of the cutting tool and a sign thereof may be hardly identified because types of defects depend on the time and situation even in the case that apparatus 30 is the same. In other words, the damage of the cutting tool may include two kinds of damages: a damage easily identified; and a damage hardly identified. When the damage easily identified occurs, diagnostic system 10 determines that apparatus 30 is in an abnormal condition. On the other hand, when the damage hardly identified occurs, diagnostic system 10 determines that apparatus 30 is in an unidentified condition. In other words, in accordance with the embodiment, the abnormal condition is abnormality known to diagnostic system 10 while the unidentified condition is abnormality unknown to diagnostic system 10. The unknown abnormality also includes a sign of defect.

As shown in FIG. 1, diagnostic system 10 includes measurement part 21, acquisition part 11, extraction part 12, determination part 13, output part 14, collection part 15, generation part 16, and storage part 17. In diagnostic system 10, acquisition part 11 and extraction part 12 constitute analysis part 24. Measurement part 21 and analysis part 24 constitute current measurement system 20.

Measurement part 21 measures AC current I1, and outputs waveform data (current waveform data) that indicates a waveform related to AC current I1. In accordance with the embodiment, measurement part 21 measures AC current I1 supplied to driver device 31 of apparatus 30. Measurement part 21 is attached to conductor 32, a conductive wire, through which AC current I1 flows from power supply device 33 to driver device 31. As shown in FIGS. 1 and 2, measurement part 21 includes current sensor 22 and shunt resistor 23.

As shown in FIG. 2, current sensor 22 includes measurement coil 220 and core 221. Measurement coil 220 is disposed near conductor 32 which is a conductive wire through which AC current I1 serving as a measurement target flows. Measurement coil 220 is magnetically coupled to conductor 32 which is a conductive wire through which AC current I1 flows. Core 221 has portion 221*b* that passes through an inside of measurement coil 220. In accordance with embodiment, core 221 has an annular shape surrounding hollow portion 221a. Core 221 is configured to allow conductor 32 (conductive wire) to pass through hollow portion 221a of core 221. AC current I1, serving as a measurement target, flows through conductor 32. In accordance with the embodiment, current sensor 22 is a current transformer. The current transformer may be preferably attached to conductor 32 after conductor 32 is installed. In other words, in accordance with the embodiment, measurement part 21 may be attached to conductor 32 after conductor 32 is installed.

Shunt resistor 23 is electrically connected across both ends 220a and 220b of measurement coil 220. Output voltage V2 across both ends 23a and 23b of shunt resistor 23 is an output of measurement part 21.

Figure 3:
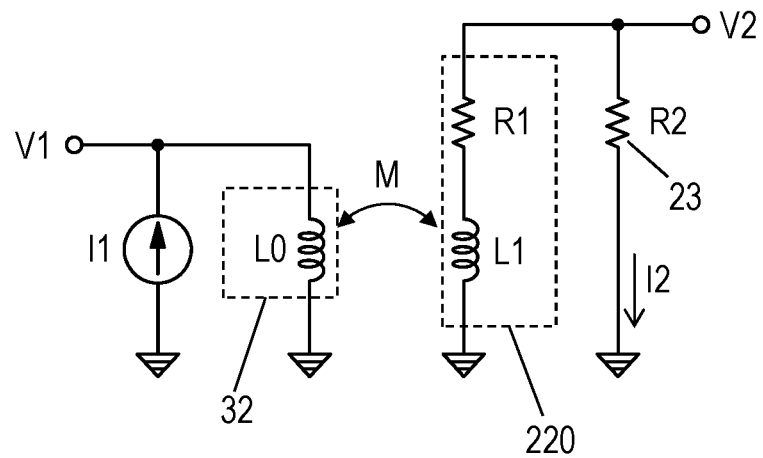
FIG. 3 shows a measurement principle of the current measurement system in accordance with the embodiment.

A relationship between current I1 as a measurement target and output voltage V2 as the output of measurement part 21 will be described below. FIG. 3 is an equivalent circuit diagram of measurement part 21. A capacitive component of measurement coil 220 is ignored in FIG. 3. In FIG. 3, conductor 32 through which AC current I1 flows has self-inductance L0. Measurement coil 220 has self-inductance L1 and reactance R1. Shunt resistor 23 has resistance R2. Voltage V1 is applied to conductor 32. Voltage V1 is the sum of a self-induced voltage caused by current I1 and a voltage caused by mutual induction between conductor 32 and measurement coil 220. Mutual inductance M is the mutual inductance between conductor 32 and measurement coil 220. Current I2 flows in shunt resistor 23.

Voltages V1 and V2 are expressed as Equation 1 with angular frequency $\omega$ of AC current I1.

$$V1 = -j\omega \cdot L0 \cdot I1 + j\omega \cdot M \cdot I2$$

$$V2 = i\omega \cdot M \ I1 - i\omega \cdot L1 \cdot I2 - R1 \cdot I2 \quad \text{[Equation 1]}$$

Since voltage V2 is equal to the product (R2·I2) of resistance R2 and current I2, voltage V2 can be expressed by Equation 2.

$$V2 = \frac{M \cdot L1 \cdot R2}{\sqrt{(R1+R2)^2 + (2\pi f \cdot L1)^2}} \cdot I1 \quad \text{[Equation 2]}$$

Voltage V2 is expressed as Equation 3 with coupling coefficient k between conductor 32 and measurement coil 220, frequency f of AC current I1, and the number of turns N of measurement coil 220.

$$V2 = \frac{k \cdot 2\pi f \cdot L1 \cdot R2}{N\sqrt{(R1+R2)^2 + (2\pi f \cdot L1)^2}} \cdot I1 \quad \text{[Equation 3]}$$

When frequency f is low, voltage V2 is expressed as equation 4, i.e., voltage V2 is proportional to frequency f.

$$V2 = \frac{k \cdot 2\pi \cdot L1 \cdot R2 \cdot I1}{N(R1+R2)^2} \cdot f \quad \text{[Equation 4]}$$

Figure 4:
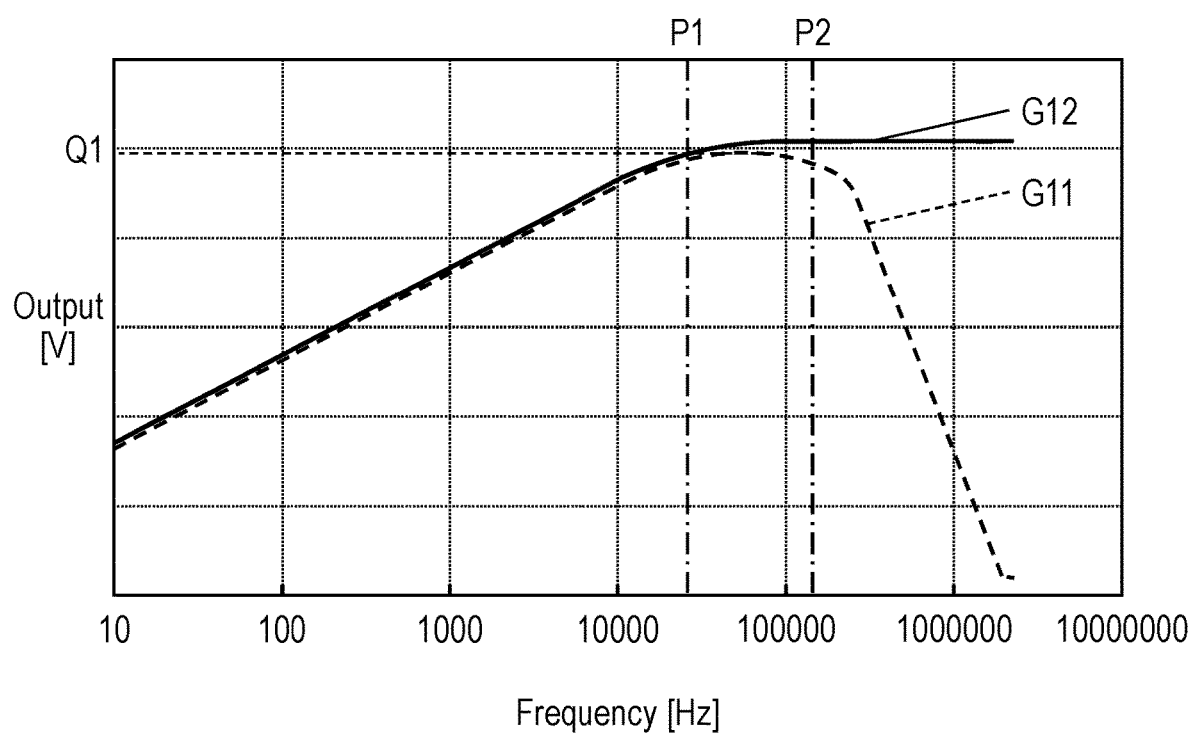
FIG. 4 shows frequency characteristics of an output of the current measurement system in accordance with the embodiment.

FIG. 4 shows frequency characteristics of output voltage V2, an output of current measurement system 20. FIG. 4 shows measured value G11 and theoretical value G12 of output voltage V2. Theoretical value G12 is based on Equation 3. Output voltage V2 across the both ends of shunt resistor 23 is saturated at saturation point Q1 at saturation frequency P1 with respect to the frequency of AC current I1 serving as a measurement target. Saturation frequency P1 is given by (R1+R2)/(2·L1). Resonance frequency P2 of measurement coil 220 is given by $1/\{2\pi \times (L1 \cdot C)^{1/2}\}$, where C is a capacitive component of the measurement coil. For an ordinary coil or transformer used for transmitting an AC signal, if the output thereof depends on a frequency rather than an external magnetic field, the coil or transformer may fail to achieve its purpose. Typically, an ordinary transformer, coil, or sensor is saturated at a frequency as low as several tens of Hz. This configuration significantly narrows a frequency band in which the transformer, coil, and sensor are not saturated. On the other hand, current sensor 20 in accordance with the embodiment may adjust an upper limit of the frequency at which current sensor 20 is saturated. Therefore, current sensor 20 is unsaturated up to high frequencies, i.e., several tens of kHz or hundreds of kHz.

As shown in FIG. 4, if frequency f of AC current I1 is lower than saturation frequency P1, output voltage V2 increases as frequency f increases. In detail, when frequency f of AC current I1 is lower than saturation frequency P1, a correlation between the frequency of AC current I1 and output voltage V2 is expressed by a straight line having a positive inclination. When frequency f is higher than saturation frequency P1, voltage V2 across both ends 23a and 23b of shunt resistor 23 is constant with respect to frequency f of AC current I1. In FIG. 4, when the frequency is higher than saturation frequency P1, measured value G11 is deviated from theoretical value G12 significantly. This is because capacitance component C of measurement coil 220 is ignored in the calculation of equation 3.

Figure 5:
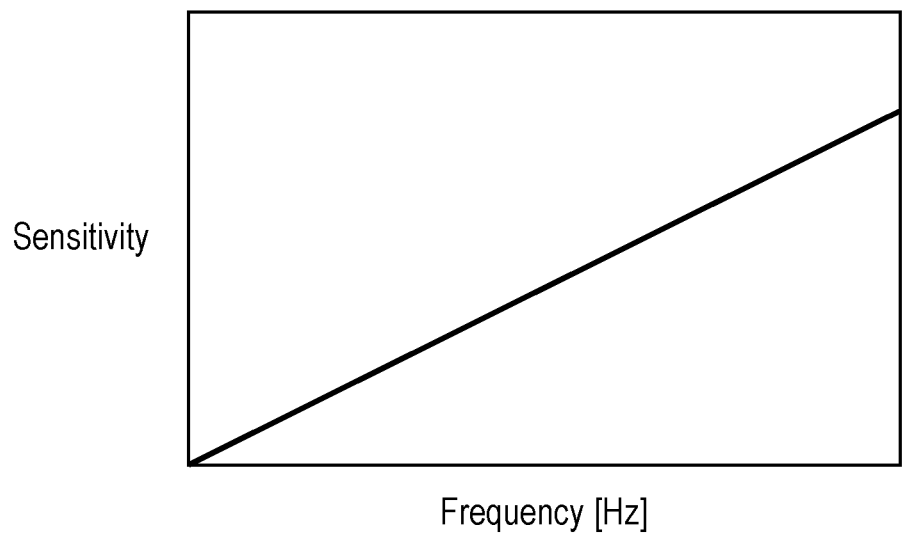
FIG. 5 shows frequency characteristics of sensitivity of the current measurement system in accordance with the embodiment.

FIG. 5 shows sensitivity of current measurement system 20 in accordance with the embodiment, when a magnitude of AC current I1 is constant. The sensitivity is a ratio (V2/I1) of output voltage V2 to AC current I1. In current measurement system 20 in accordance with the embodiment, an upper limit value of the measurement range of frequency f is higher than the fundamental frequency of AC current I1. In other words, saturation frequency P1 is higher than or equal to the upper limit value of the measurement range of the frequency of current measurement system 20. Therefore, the sensitivity (V2/I1) of current measurement system 20 in accordance with the embodiment depends on frequency, as shown in FIG. 5. The sensitivity of current measurement system 20 in accordance with the embodiment increases as the frequency f increases. In detail, the sensitivity of current measurement system 20 in accordance with the embodiment is expressed by a straight line having a positive inclination with respect to frequency f of AC current I1. As mentioned above, saturation frequency P1 is given by (R1+R2)/(2π·L1). In other words, saturation frequency P1 depends on self-inductance L1 and reactance R1 of measurement coil 220 and resistance R2 of shunt resistor 23. In accordance with the embodiment, self-inductance L1 and reactance R1 of measurement coil 220 and resistance R2 of shunt resistor 23 are determined such that a magnitude that saturation frequency P1 is higher than or equal to the upper limit value of the measurement range.

In the case that reactance R1 of measurement coil 220 is relatively small enough to be ignored, saturation frequency P1 is given by R2/(2π·L1), so that equation 3 is expressed as Equation 5.

$$V2 = \frac{k \cdot 2\pi f \cdot L1 \cdot R2}{N\sqrt{R2^2 + (2\pi f \cdot L1)^2}} \cdot I1 \quad \text{[Equation 5]}$$

In accordance with the embodiment, the upper limit value of the measurement range of frequency f is set to be 10 times or higher of the fundamental frequency of AC current I1 serving as a measurement target. Further, a lower limit value of the measurement range is higher than zero.

If the cutting tool of apparatus 30 is not in the normal condition, the cutting tool may cause a shear, a pluck, or a crack in apparatus 30 when processing the workpiece. In such a case, a force may be applied to driver device 31 in a direction along a rotational axis of the workpiece. A force applied in a direction in which a tool (cutting tool) presses a workpiece is called a back force. A force against a processing direction, i.e., a direction in which a cutting tool moves to a workpiece is called a feed force. In driver device 31, since the cutting tool is held at a predetermined position with respect to the workpiece in a direction along an axis about which the workpiece rotates, a force is applied to the rotor of the motor in the direction along the axis about which the workpiece rotates. Driver device 31 (the rotor of the motor) receives this force while performing the predetermined work in apparatus 30. Such a force may affect a change in angular velocity of the rotor. The change in the angular velocity of the rotor may be reflected on current I1 supplied to the motor. When a force is applied in the direction along the rotational axis of the workpiece to deviate the cutting tool from the predetermined position, apparatus 30 performs a control to return the cutting tool to the predetermined position. Accordingly, a change in the current, which is caused by such control, may occur in current I1 supplied to the motor.

In other words, the change caused by a component in a particular direction of a force applying to driver device 31 may occur in current I1 supplied to driver device 31. The particular direction may be a direction along the axis about which one of the cutting tool and the workpiece rotates with respect to the other thereof. Driver device 31 receives AC current I1 while performing the predetermined work in apparatus 30. Measurement part 21 measures AC current I1 supplied to driver device 31 of apparatus 30, and outputs waveform data (current waveform data) indicating a waveform related to AC current I1. As an example, measurement part 21 is attached to conductor 32.

Diagnostic system 10 does not require to arrange measurement part 21 near driver device 31. As long as measurement part 21 can measure the current supplied to the motor, measurement part 21 may be disposed inside, e.g. a control panel accommodating power supply device 33 therein. Thus, a device for installing measurement part 21 or wire routing is unnecessary in a mechanical part of apparatus 30. Further, a balance adjustment resulting from the installation of measurement part 21 may be eliminated. Furthermore, in the installation of measurement part 21, some measures (e.g., oil-proof measures, heat-resistant measures, water-proof measures, or the like) for enabling measurement part 21 to operate under workpiece-processing environment are unnecessary. Thus, measurement part 21 requires less maintenance burden. Further, this configuration provides waveform data even when apparatus 30 is in operation. Therefore, to perform diagnosis in diagnostic system 10, the work of apparatus 30 is not interrupted. This prevents the diagnosis from prolonging a processing cycle. Furthermore, even when apparatus 30 is in operation, waveform data can be obtained. Thus, the conditions (e.g., a degree of wear) of the cutting tool may be obtained as necessary, so that the cutting tool may be used up. Further, the unidentified condition which is different from normality or abnormality may be detected, thereby reducing difficulties (e.g., occurrence of defective products) resulting from the unidentified condition of the cutting tool. In other words, diagnostic system 10 provides condition based maintenance (CBM) rather than time based maintenance (TBM) as maintenance of apparatus 30.

Analysis part 24 includes acquisition part 11 and extraction part 12.

Acquisition part 11 acquires waveform data (current waveform data) that indicates a waveform related to AC current I1 supplied to driver device 31 of apparatus 30. In detail, acquisition part 11 connected to measurement part 21 acquires waveform data from measurement part 21. The waveform data from measurement part 21 is time series data of output voltage V2 in measurement part 21.

Acquisition part 11 acquires the waveform data indicating the waveform related to AC current I1 supplied to the driver device 31 of the apparatus 30, i.e., the time series data of output voltage V2.

Extraction part 12 acquires information to be used in determination part 13 from the waveform data acquired in acquisition part 11. The information to be used in determination part 13 relates to the change caused by a component of a force in a particular direction applied to the driver device. Extraction part 12 converts the waveform indicated by the waveform data acquired in acquisition part 11 into a frequency axis waveform. In more detail, extraction part 12 performs frequency analysis on the time series data of output voltage V2 to acquire harmonic component data of AC current I1 serving as a measurement target. Extraction part 12 extracts an attention part from the frequency axis waveform obtained through the conversion. Herein, the attention part may include the change caused by a component of the force in the particular direction applied to driver device 31.

In AC current I1 supplied to driver device 31 of apparatus 30, the change caused by the component of the force in the particular specific direction applied to driver device 31 easily appears in a component of a frequency region higher than the fundamental frequency. As mentioned above, in current measurement system 20 in accordance with the embodiment, saturation frequency P1 is set to be higher than or equal to the upper limit value of the measurement range including the fundamental frequency of AC current I1 serving as a measurement target. As shown in FIG. 5, sensitivity (V2/I1) of current measurement system 20 in accordance with the embodiment has frequency dependency, so that the sensitivity increases as frequency f increases. Accordingly, current measurement system 20 in accordance with the embodiment sensitively extracts the attention part which may include the change caused by the component of the force in the particular direction applied to driver device 31.

PTL 1 describes that a shunt resistor ranging from several tens to hundreds of ohms is used for measuring a leak current, and that a shunt resistor with a low resistance of several ohms is used for measuring a load current. This literature does not describe sensitivity to the frequency of an AC current although the amplitude of AC current is considered.

Figure 6:
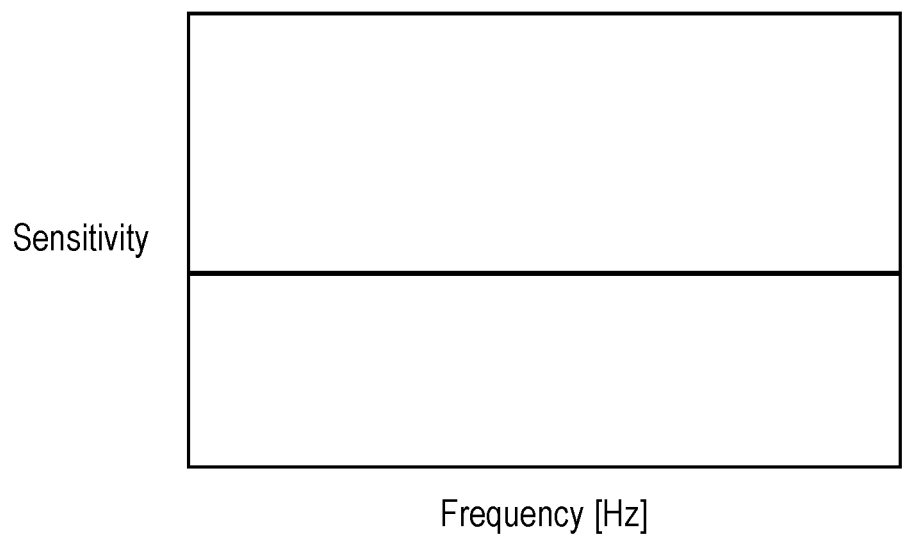
FIG. 6 shows frequency characteristics of sensitivity of a current measurement system of a comparative example.

Advantages of current measurement system 20 in accordance with the embodiment will be described based on a comparative example of current measurement system 20. FIG. 6 shows frequency characteristics of sensitivity of a current measurement system of a comparative example. In the current measurement system of the comparative example, saturation frequency P1 is lower than the fundamental frequency of AC current I1 serving as a measurement target, i.e., set to be lower than or equal to the lower limit value of the measurement range, unlike current measurement system 20 in accordance with the embodiment. In other words, as shown in FIG. 6, the sensitivity of current measurement system 20 of the comparative example does not depend on the frequency (in FIG. 6, the magnitude of current I1 is constant). In other words, the sensitivity of the current measurement system of the comparative example is constant without depending on the frequency.

Figure 7:
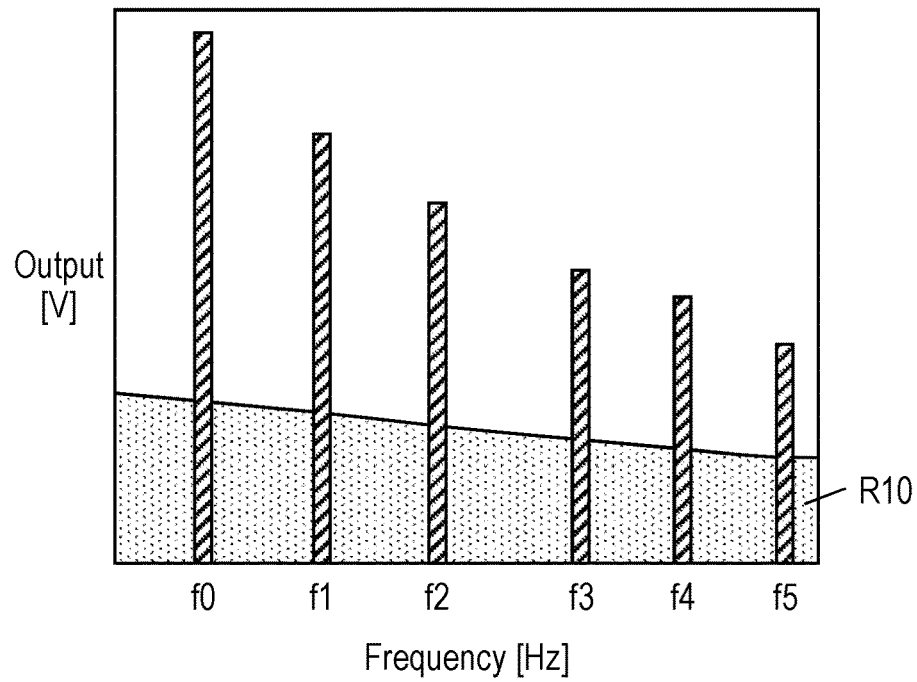
FIG. 7 shows frequency components obtained by the current measurement system in accordance with the embodiment.
Figure 8:
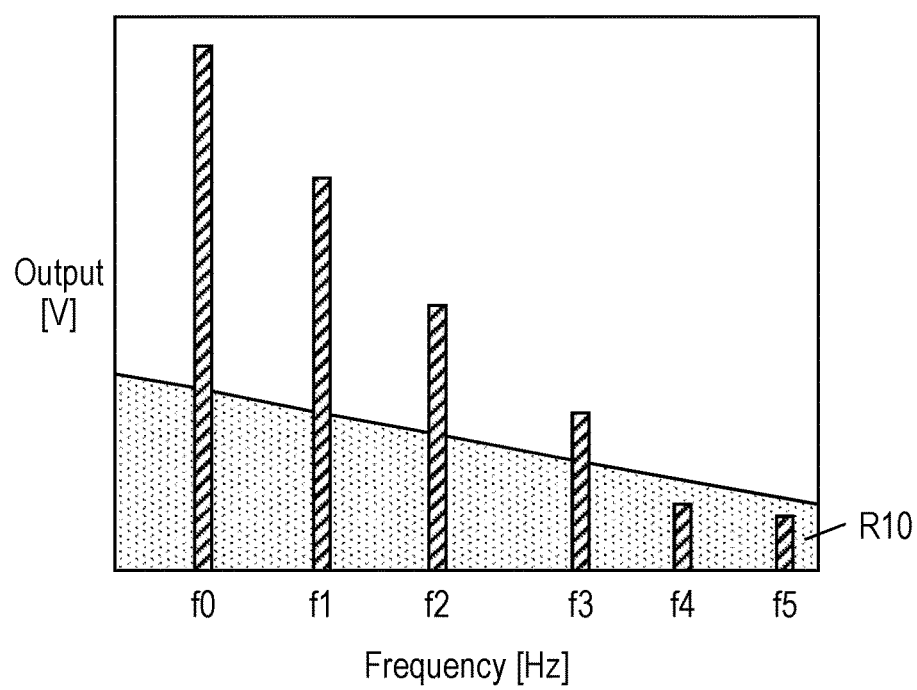
FIG. 8 shows frequency components obtained by the current measurement system of the comparative example.
Figure 9:
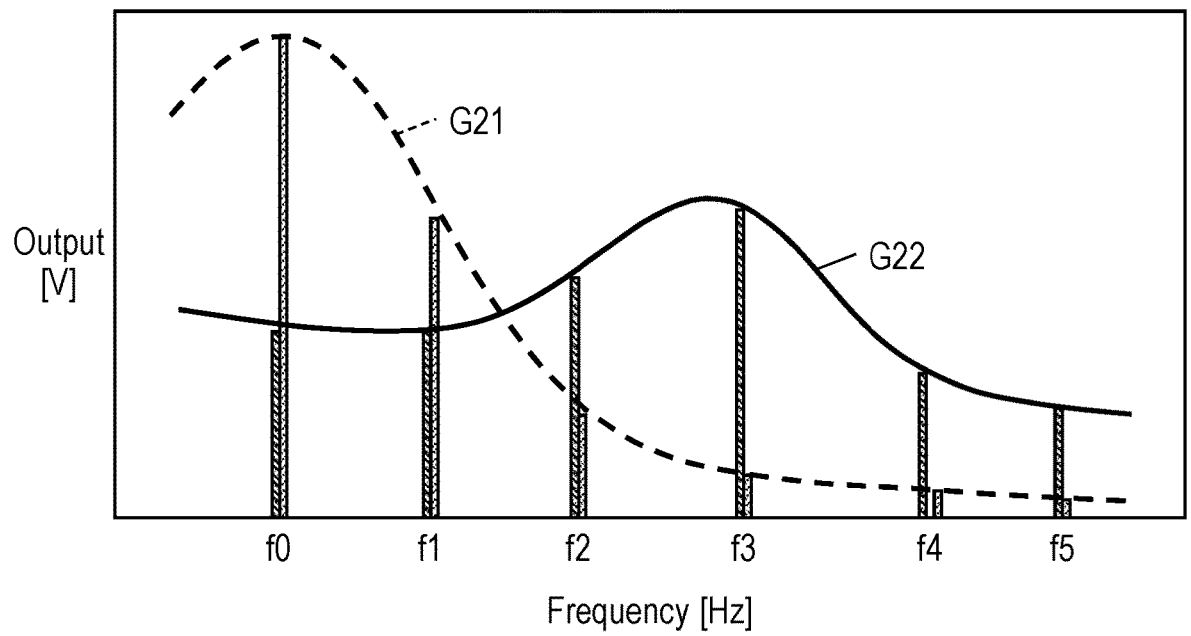
FIG. 9 shows frequency components obtained by the current measurement system in accordance with the embodiment.
Figure 10:
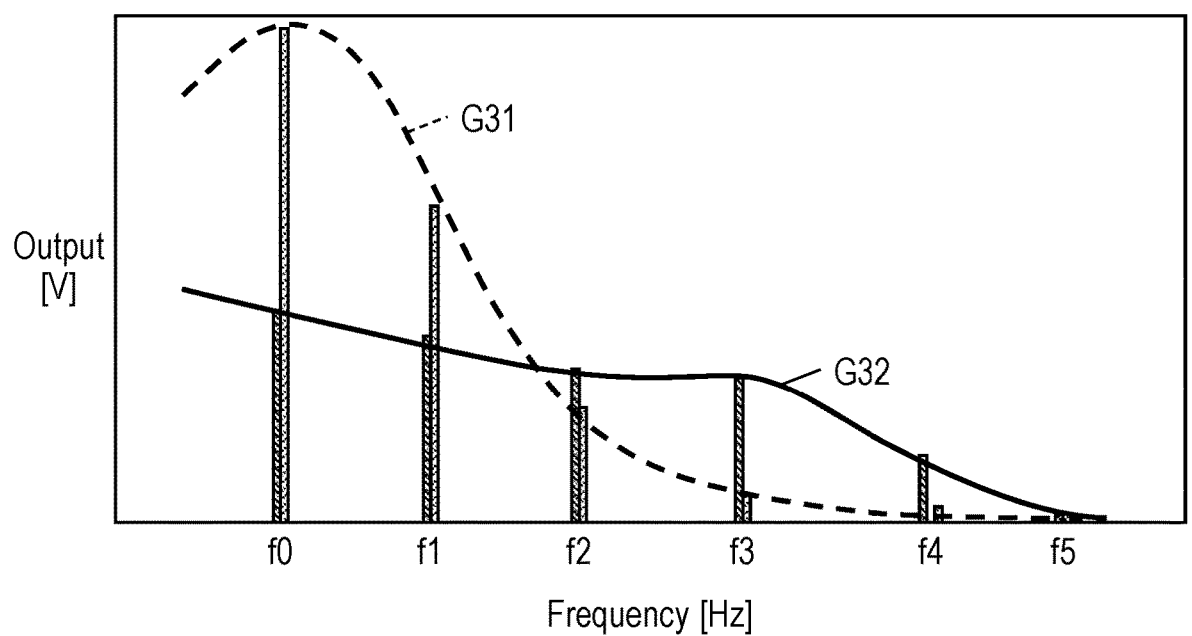
FIG. 10 shows frequency components obtained by the current measurement system of the comparative example.

FIGS. 7 and 9 show frequency components of the waveform of output voltage V2 of current measurement system 20 in accordance with the embodiment. FIGS. 8 and 10 show frequency components of the waveform of output voltage V2 of the current measurement system of the comparative example. The scaling of frequency in FIGS. 7-10 is an example. This point is the same as in FIGS. 11-14.

FIGS. 7 and 8 show sensitivity i.e., the magnitude of frequency component of the waveform of output voltage V2 obtained by current measurement system 20 in accordance with the embodiment and the magnitude of components of frequencies of the waveform of output voltage V2 obtained by the current measurement system of the comparative example, respectively. In this case, the same magnitude of AC currents I1 having frequencies f0, f1, ... are input to current measurement system 20 in accordance with the embodiment and the current measurement system of the comparative example. As mentioned above, the sensitivity (V2/I1) of current measurement system 20 in accordance with the embodiment increases as frequency f increases, whereas the sensitivity of the current measurement system of the comparative example is constant without depending on frequency f. For instance, if components of fundamental frequency f0 and harmonic frequencies f1, f2, f3, f4, f5, ... are included in AC current I1 serving as a measurement target, outputs of current measurement system 20 of the embodiment corresponding to the components of harmonic frequencies f1, f2, f3, f4, f5, ... are larger than those of the current measurement system of the comparative example, as shown in FIGS. 7 and 8. Therefore, current measurement system 20 of the embodiment separates the components of harmonic frequencies f1, f2, f3, f4, f5, ... from noise region R10. In the current measurement system of the comparative example, the components of harmonic frequencies f4, f5, ... exist in noise region R10, being hardly separated from noise region R10 accordingly.

FIGS. 9 and 10 show frequency components of the output voltage of current measurement system 20 in accordance with embodiment and frequency components of the output voltage of the current measurement system of the comparative example, respectively. AC current I1 supplied to the motor of driver device 31 is input to current measurement system 20 in accordance with the embodiment and the current measurement system of the comparative example. Particularly in accordance with the embodiment, AC current I1 serving as a measurement target is supplied to the motor of driver device 31. Accordingly, AC current I1 serving as a measurement target includes a torque component caused by a fluctuation, and an attention part component caused by a change in the condition of apparatus 30 such as abnormality. FIG. 9 shows torque component G21 and component G22 in the attention part of current measurement system 20 of the embodiment. FIG. 10 shows torque component G31 and component G32 in the attention part of the current measurement system of the comparative example. Torque components G21 and G31 each have the largest output component at the fundamental frequency of current I1 serving as a measurement target, and decreases as the frequency increases. On the other hand, components G22 and G32 in the attention part increase at frequencies f1, f2, ... higher than fundamental frequency f0 of AC current I1 serving as a measurement target. For this reason, current measurement system 20 of the embodiment provides larger outputs of the attention part component than the current measurement system of the comparative example.

Figure 11:
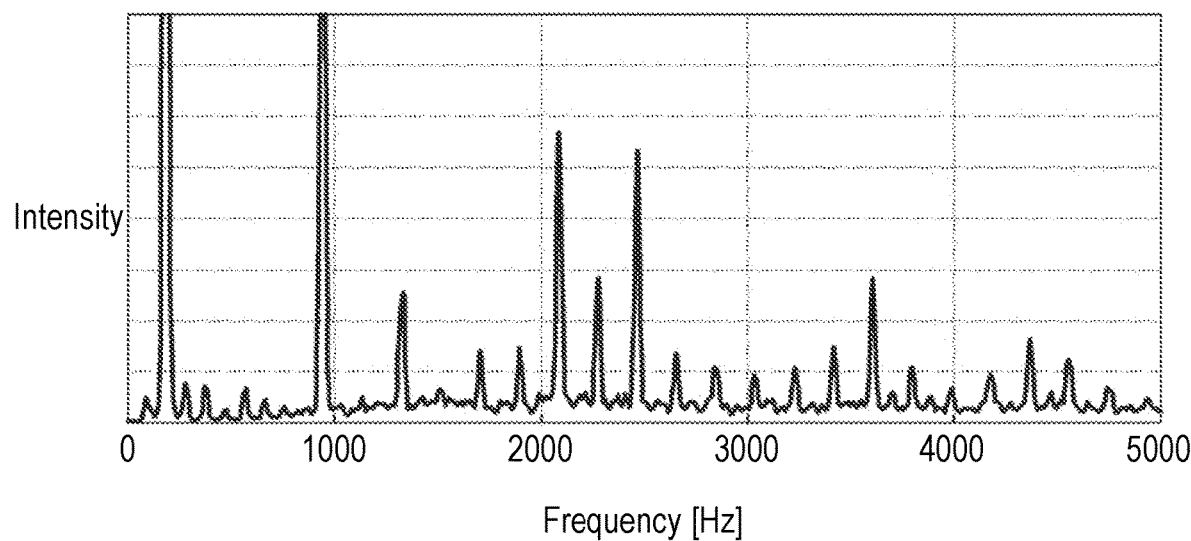
FIG. 11 shows frequency components of an alternating-current (AC) current obtained by the current measurement system in accordance with the embodiment.
Figure 12:
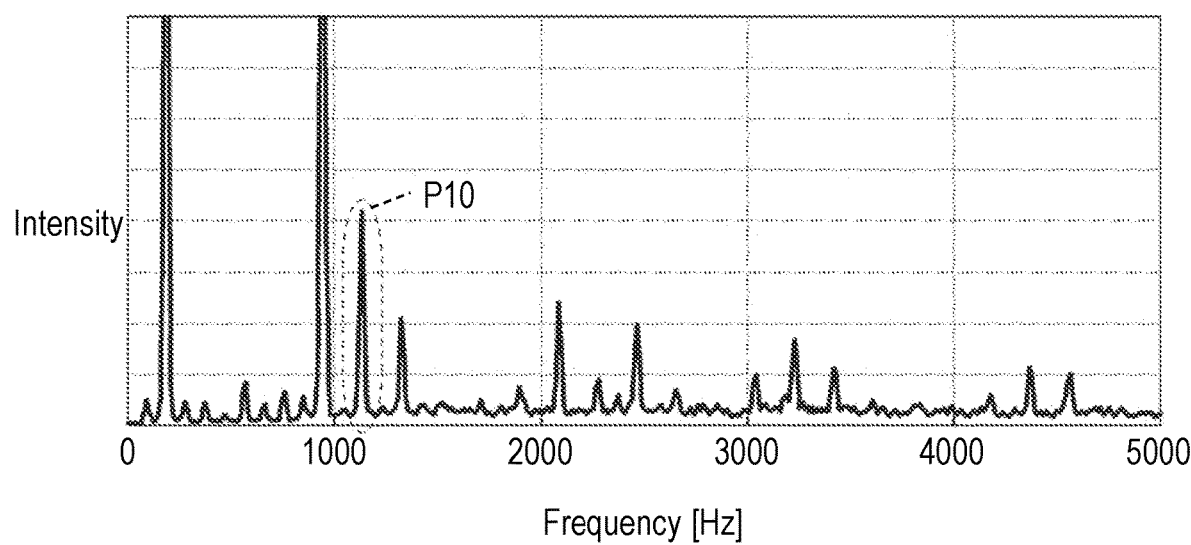
FIG. 12 shows frequency components of an AC current obtained by the current measurement system in accordance with the embodiment.

As an example, in FIGS. 11 and 12, waveform data (current waveform data) output from current measurement system 20 of the embodiment is shown with a frequency axis. FIG. 11 shows the waveform data when the cutting tool is in the normal condition (when the condition of apparatus 30 is normal). FIG. 12 shows the waveform data when a defect occurs (when the condition apparatus 30 is abnormal) in the cutting tool. As shown in FIGS. 11 and 12, a difference, such as particular part P10, is observed in the frequency axis waveform. This difference is caused by a force applied to the rotor of the motor of driver device 31 in the direction along the axis about which one of the cutting tool and the workpiece rotates relative to the other thereof. Extraction part 12 thus extracts, from the frequency axis waveform, the attention part which may include a change caused by a back force applied to driver device 31. In the example of FIGS. 3 and 4, extraction part 12 may extract a region in a frequency range from 1000 Hz to 1200 kHz from the frequency axis waveform, as the attention part.

Figure 13:
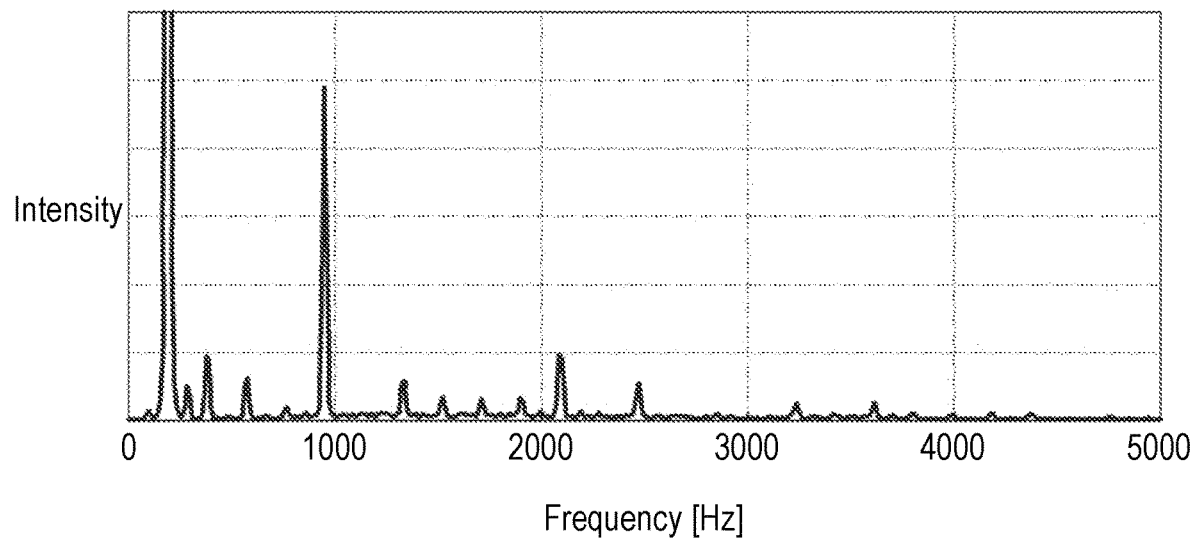
FIG. 13 shows frequency components of the AC current obtained by the current measurement system of the comparative example.
Figure 14:
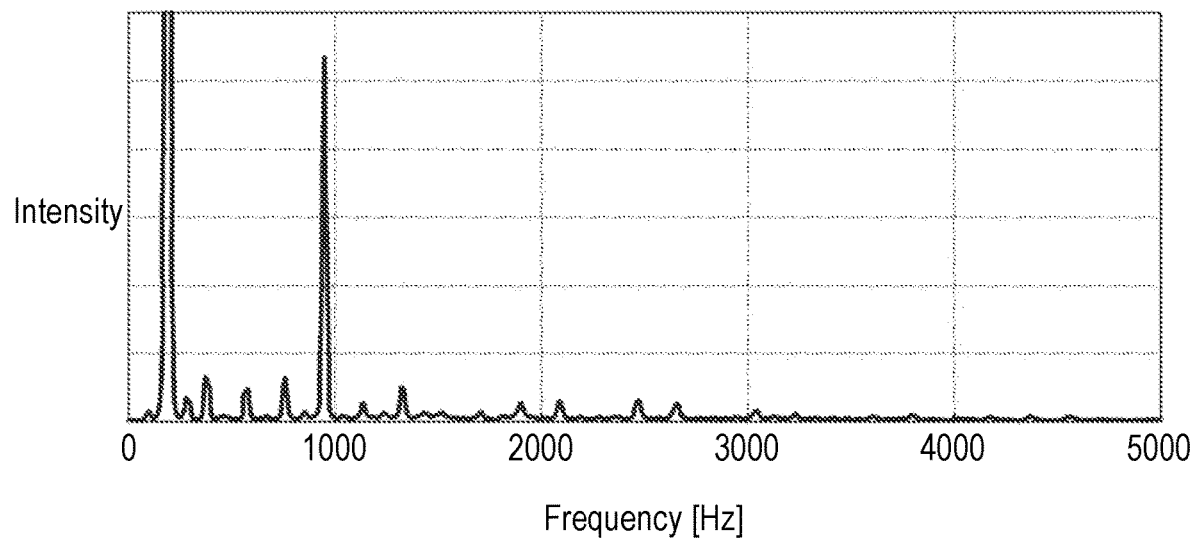
FIG. 14 shows frequency components of the AC current obtained by the current measurement system of the comparative example.

FIGS. 13 and 14 show a frequency axis waveform obtained from the waveform data (current waveform data) output from the current measurement system of the comparative example. FIG. 13 shows a waveform of the current when the cutting tool is in the normal condition (when the condition of apparatus 30 is normal). FIG. 14 shows a waveform of the current when a defect occurs (when the condition apparatus 30 is abnormal) in the cutting tool. As shown in FIGS. 13 and 14, a difference between the two cases, mentioned above, is not seen in the frequency axis waveform. Accordingly, this shows the current measurement system of the comparative example hardly determines abnormality of apparatus 30.

Determination part 13 determines the condition of apparatus 30 from the change caused by a component of the force in a particular direction applies to driver device 31. In accordance with the embodiment, determination part 13 determines the condition of apparatus 30 based on the attention part extracted by extraction part 12. The condition of apparatus 30 includes a normal condition, an abnormal condition, and an unidentified condition which is neither the normal condition nor the abnormal condition. In other words, determination part 13 determines which if the normal condition, the abnormal, or in the unidentified condition apparatus 30 is in.

Determination part 13 determines, using learned models M11 and M12, the condition of apparatus 30 from the attention part. Learned model M11 is designed to output an unknown value (unknown degree) with respect to a given inputs (the attention part). Determination part 13 gives the attention part which is obtained from extraction part 12 to learned model M11, thereby determining whether the condition of apparatus 30 is in the unidentified condition or not based on the obtained value (unknown value) from learned model M11. For instance, if the unknown value is more than or equal to a threshold, determination part 13 may determine that the condition of apparatus 30 is in the unidentified condition. If the unknown value is less than the threshold, determination part 13 may determine that the condition of apparatus 30 is not in the unidentified condition. Learned model M11 may be generated by using unsupervised learning. The unsupervised learning utilizes the attention part obtained when the condition of apparatus 30 is normal or abnormal, as learning data (training sample). Learned model M12 is designed to output an abnormal value (abnormal degree) with respect to the given input (attention part). Determination part 13 gives learned model M12 the attention part which is obtained from extraction part 12 to learned model M12, thereby determining whether the condition of apparatus 30 is normal or abnormal based on the obtained value (abnormal value) from learned model M12. For instance, if the abnormal value is more than equal to a threshold, determination part 13 may determine that the condition of apparatus 30 is abnormal. Further, if the abnormal value is less than the threshold, determination part 13 may determine that the condition of apparatus 30 is normal. Such learned model M12 may be generated by using supervised learning. The supervised learning uses learning data (data set) specifying a relationship between the attention part and a label corresponding to the abnormal value. Learned models M11 and M12 are stored in storage part 17. Storage part 17 may store a set of learned models M11 and M12 for each kind of the cutting tool. In other words, storage part 17 may store two or more sets of learned models M11 and M12 each corresponding to a corresponding one of plural kinds of the cutting tool.

Output part 14 outputs a determination result of determination part 13. Output part 14 includes, e.g. an audio output device and a display. The display is a thin display device, such as a liquid crystal display or an organic electroluminescence display. Output part 14 may display the determination result of determination part 13 on the display, or may announce it via the audio output device. Further, output part 14 may transmit the determination result of determination part 13 to an external device, or may store it therein. Output part 14 does not necessarily provide both the audio output device and the display. Output part 14 may output the determination result of determination part 13 via, e.g. e-mail.

Collection part 15 collects the data acquired by acquisition part 11, and stores it. In the present exemplary embodiment, the data acquired by acquisition part 11 includes the waveform data from measurement part 21. The data collected by collection part 15 is used for generating and updating learned models M11 and M12.

Generation part 16 generates learned models M11 and M12 to be used in determination part 13. Using learning data of a predetermined amount or more, generation part 16 generates learned models M11 and M12 through machine learning algorithm. The learning data may be previously prepared, or may be generated from the data stored in collection part 15. If the learning data generated from the data stored in collection part 15 is employed, more improvement will be expected in precision of the condition determination using learned models M11 and M12. Especially, even when the condition is determined to be in the unidentified condition, if it is determine that the condition is normal or abnormal, additional learning will be performed about an unidentified condition in which it is determined that the condition is normal or abnormal. Thus, precision in determination of normality or abnormality is more improved.

Generation part 16 evaluates newly-generated learned models M11 and M12. When the evaluation result of learned models M11 and M12 is improved, learned models M11 and M12 stored in storage part 17 is replaced by newly-generated learned models M11 and M12, thereby updating learned models M11 and M12. As a method for generating learned models M11 and M12, as mentioned above, the unsupervised learning or the supervised learning may be employed depending on contents of the condition, as necessary. A typical dimensional compression method can be employed as the unsupervised learning. The typical dimensional compression method includes a principal component analysis, a self-organization map, an auto encoder, and the like. Further, a typical multilayer neural network having a supervised learning system may be employed as the supervised learning.

Acquisition part 11, extraction part 12, determination part 13, output part 14, collection part 15, and generation part 16 of diagnostic system 10 may be implemented by, e.g. a computer system that includes one or more processors (microprocessor, as an example) and one or more memories. In other words, the one or more processors execute one or more programs stored in the one or more memories, thereby functioning as acquisition part 11, extraction part 12, determination part 13, output part 14, collection part 15, and generation part 16. The one or more programs may be recorded in the memory in advance. Alternatively, the one or more programs may be provided via electric telecommunication lines, such as the Internet, or may be recorded in a non-transitory recording medium, such as a memory card, to be provided.

(1.3) Operation

Figure 15:
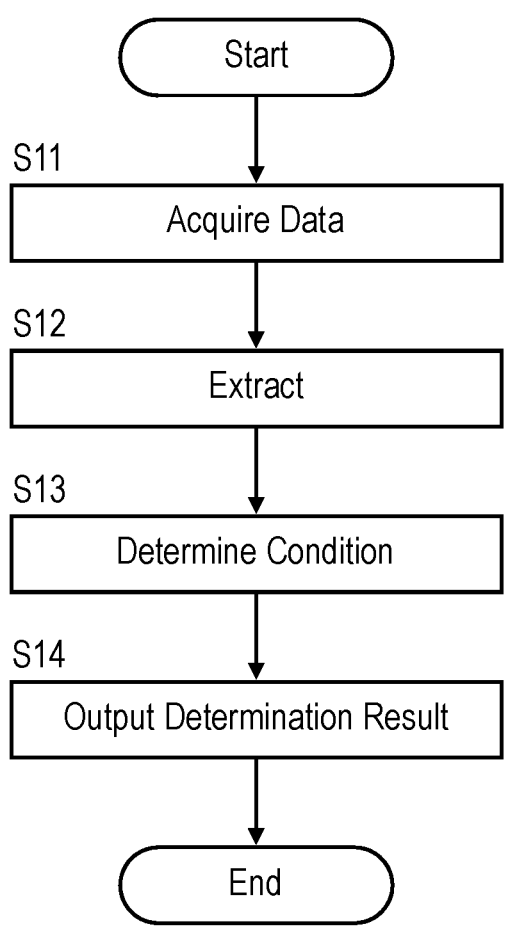
FIG. 15 is a flowchart of an operation of the diagnostic system.

A fundamental operation of diagnostic system 10 will be described briefly below. FIG. 15 is a flowchart showing an operation of diagnostic system 10.

Acquisition part 11 acquires, from measurement part 21, the waveform data (current waveform data) that indicates a waveform related to AC current I1 supplied to the motor of driver device 31 of apparatus 30 (Step S11). Next, extraction part 12 converts the waveform indicated by the waveform data acquired in acquisition part 11 into a frequency axis waveform, and extracts, from the frequency axis waveform, a part including the change caused by a component of a force in a particular direction applied to driver device 31 (Step S12). After that, using two or more learned models M11 and M12, determination part 13 determines the condition of apparatus 30 from the part extracted by extraction part 12 (Step S13). Finally, output part 14 outputs the determination result of determination part 13 (Step S14). From the waveform data indicating the waveform related to AC current I1 supplied to driver device 31, diagnostic system 10 can diagnose the mechanism part driven by driver device 31 and show the result thereof.

(2) Modification

The exemplary embodiment of present disclosure is not limited to the above-mentioned exemplary embodiment. As long as achieving the aim of the present disclosure, the above-mentioned exemplary embodiment can be modified variously according to design or the like. Modifications of the above-mentioned exemplary embodiment will be described below.

According to a modification, the upper limit value of the measurement range of the frequency of current measurement system 20 is higher than fundamental frequency f0 of AC current I1 serving as a measurement target. The measurement range is set to include frequency components, especially harmonic components that contribute to determining the condition of apparatus 30 of determination part 13. The upper limit value of the measurement range is higher than or equal to twice the fundamental frequency of AC current I1. The upper limit value may be higher than or equal to five times the fundamental frequency of AC current I1 serving as a measurement target, or may be higher than or equal to 10 times the fundamental frequency. The lower limit value of the measurement range, which is not limited especially, is higher than zero. As mentioned above, the harmonic component contributes to determining the condition of apparatus 30 of determination part 13. Thus, the lower limit value may be the fundamental frequency of AC current I1 serving as a measurement target, or may be higher than the fundamental frequency. That is, the frequency measurement range of current measurement system 20 may not necessarily necessary include the fundamental frequency of AC current I1 serving as a measurement target.

In measurement part 21, measurement coil 220 is not necessarily composed of a single coil, but may be composed of one or more coils. Shunt resistor 23 is not necessarily composed of a single resistor, but may be composed of one or more resistors. In accordance with the embodiment, output voltage V2 across both ends of shunt resistor 23 is used as an output of measurement part 21, but measurement part 21 may include a circuit element, such as an amplifier that amplifies output voltage V2.

Current measurement system 20 may not necessarily include analysis part 24. Further, measurement part 21 may not necessarily include core 221. Current sensor 22 may not necessarily be a current transformer. Current sensor 22 has a function that measures current using a measurement coil. Herein, the measurement coil is magnetically coupled to the conductor through which AC current I1, serving as a measurement target, flows. In other words, well-known current sensors other than a current transformer may be used as current sensor 22.

Determination part 13 determines the condition of apparatus 30 as any of normality, abnormality, and the unidentified condition, but not limited to this. Determination part 13 may determine degrees of normality, abnormality, and the unidentified condition. By doing this, diagnostic system 10 can give different notifications according to the degrees of normality, abnormality, and the unidentified condition. For example, if the degree of normality is low, diagnostic system 10 may announce that the condition is more likely to be abnormal or in the unidentified condition. Further, if the degrees of abnormality and the unidentified condition exceed a threshold, diagnostic system 10 may perform processing for stopping operation of apparatus 30, notification, or the like. Alternatively, the condition of apparatus 30 is not limited to three kinds of determination, i.e., normality, abnormality, and the unidentified condition, but may be four or more kinds of determination, or may be two kinds of determination.

Diagnostic system 10 may not necessarily include collection part 15, generation part 16, and storage part 17. In other words, diagnostic system 10 may not necessarily have a function that updates learned models M11, M12, . . . by itself. Further, storage part 17 may not necessarily store plural learned models, such as learned models M11 and M12.

Diagnostic system 10 may not necessarily include extraction part 12. For instance, when the processing in extraction part 12 is performed by a user or the other device on behalf of extraction part 12, diagnostic system 10 does not necessarily extract the part including the change caused by a component of a force in a particular direction applied to driver device 31. Diagnostic system 10 may obtain the entirety of the waveform which is indicated by the waveform data acquired by acquisition part 11 as an input, and may obtain the condition of apparatus 30 from learned models M11 and M12 as an output. In other words, extraction of the part including the change may be omitted.

Diagnostic system 10 may not necessarily include output part 14. For example, Diagnostic system 10 may output the condition of apparatus 30 which is determined by determination part 13 to the outside of diagnostic system 10.

Diagnostic system 10 may be implemented by plural computers. The functions (especially, acquisition part 11, extraction part 12, determination part 13, output part 14, collection part 15, and generation part 16) of diagnostic system 10 may be distributed to plural devices. For instance, acquisition part 11, extraction part 12, determination part 13, and output part 14 may be provided in a personal computer or the like, which is installed in an institution of the apparatus. Generation part 16 and output part 14 may be provided in an external server or the like. In this case, the personal computer and the server are collaborated with each other to provide diagnostic system 10. At least a part of functions of diagnostic system 10 may be implemented by, e.g. Cloud (cloud computing).

The execution subject of diagnostic system 10, described above, includes a computer system. The computer system has a processor and a memory as hardware. The processor executes a program recorded in the memory of the computer system, thereby achieving the functions as the execution subject of diagnostic system 10. The program may be recorded in the memory of the computer system in advance, but may be provided via electric telecommunication lines. Further, the program may be recorded in a non-transitory recording medium such as a memory card, which is readable by the computer system, an optical disk, and a hard disk drive. The processor of the computer system is constituted by one or more electronic circuits that include a semiconductor integrated circuit (IC) or a large-scale integrated circuit (LSI). Herein, the electric circuits are referred to as an IC or an LSI, but the name thereof is changed depending on the degree of integration, i.e., may be referred to as a system LSI, a VLSI (very large scale integration), or a VLSI (ultra large scale integration). A field programmable gate array (FGPA), which is programmed after fabrication of an LSI, or a reconfigurable logic device can also be used for the same aim. Herein, the reconfigurable logic device can reconfigure a connection relationship inside an LSI or set up circuit sections inside an LSI. The plurality of electronic circuits may be integrated in one chip, or may be divided into a plurality of chips. The plurality of chips may be integrated in one device, or may be divided into a plurality of devices.

In accordance with the embodiment, apparatus 30 is a lathe, but not limited to this. For instance, apparatus 30 may be a pump. Specifically, apparatus 30 may be a vacuum pump. The vacuum pump is used in various kinds of fields, such as fabrication of a semiconductor device. In this case, diagnostic system 10 may determine condition of an impeller of apparatus 30 or deterioration in an impeller bearing as the condition of apparatus 30. Further, apparatus 30 may be a component mounting machine. Specifically, apparatus 30 may be a robot (robot arm) for performing component mounting (assembly). In this case, diagnostic system 10 may determine attachment condition of components as the condition of apparatus 30. Further, apparatus 30 may be a polishing device. Specifically, apparatus 30 may be a polishing device for performing chemical mechanical polishing. In this case, diagnostic system 10 may determine condition of a polishing pad and a dresser as the condition of apparatus 30.

(3) Aspects

As described in the embodiments and modifications, the present disclosure includes the following aspects. In the following, only to clearly indicate correspondence between the exemplary embodiments and the following aspects, the reference numerals enclosed in brackets are assigned.

According to a first aspect, a current measurement system (20) includes a current sensor (22) including a measurement coil (220) magnetically coupled to a conductor (32) through which an alternating-current (AC) current (I1) serving as a measurement target flows and a shunt resistor (23) electrically connected between both ends (220a, 220b) of the measurement coil (220). The current measurement system (20) has a saturation point at which an output voltage (V2) across the both ends of shunt resistor (23) is saturated with respect to a frequency of the AC current (I1) serving as a measurement target. An upper limit value of a measurement range of frequency is higher than a fundamental frequency of the AC current (I1) serving as the measurement target. A saturation frequency at the saturation point is higher than or equal to the upper limit value. According to the first aspect, sensitivity to a frequency component higher than the fundamental frequency of AC current (I1) is improved.

According to a second aspect, current measurement system (20) is based on the first aspect. In the second aspect, a correlation between the frequency of the AC current (I1), serving as the above-mentioned measurement target, and above-mentioned output voltage (V2) is expressed by a straight line having a positive inclination in the above-mentioned measurement range. According to the second aspect, sensitivity to a component with a frequency higher than the fundamental frequency of the AC current (I1) is be improved.

According to a third aspect, current measurement system (20) is based on the first aspect or the second aspect. In the third aspect, the output voltage V2 is expressed by equation 3:

$$V2 = \frac{k \cdot 2\pi f \cdot L1 \cdot R2}{N\sqrt{(R1+R2)^2 + (2\pi f \cdot L1)^2}} \cdot I1 \quad \text{[Equation 3]}$$

where, V2 is the output voltage, I1 is the AC current serving as the measurement target, k is a coupling coefficient between the conductor (32) and the measurement coil (220), f is the frequency f of the AC current (I1) serving as the measurement target, L1 is a self-inductance of the measurement coil (220), R1 is a reactance of the measurement coil (220), R2 is a resistance of the shunt resistor (23), and N is the number of turns of the measurement coil (220), According to the third aspect, sensitivity to a component with a frequency higher than the fundamental frequency of AC current (I1) is improved.

According to a fourth aspect, current measurement system (20) is based on any one of the first to third aspects. According to the fourth aspect, the self-inductance and the reactance of the measurement coil (220), and the resistance of the shunt resistor (23) may be determined such that the saturation frequency is higher than or equal to the upper limit value of the measurement range. According to the fourth aspect, sensitivity to a component with a frequency higher than the fundamental frequency of the AC current (I1) is improved.

According to a fifth aspect, current measurement system (20) is based on any one of the first to fourth aspects. According to the fifth aspect, the upper limit value of the measurement range is higher than or equal to 10 times the fundamental frequency of the AC current (I1) serving as the measurement target. According to the fifth aspect, sensitivity to a component with a frequency higher than the fundamental frequency of the AC current (I1) is improved.

According to a sixth aspect, current measurement system (20) is based on any one of the first to fifth aspects. According to the sixth aspect, the current sensor (22) further includes core (221) having at least one part passing through an inside of the measurement coil (220). According to the sixth aspect, sensitivity to a component with a frequency higher than the fundamental frequency of the AC current (I1) is improved.

According to a seventh aspect, current measurement system (20) is based on any one of the first to sixth aspects. According to the seventh aspect, the current measurement system (20) further includes analysis part (24) configured to perform frequency analysis on time series data of the output voltage (V2) to acquire harmonic component data of the AC current (I1) serving as the measurement target. According to the seventh aspect, sensitivity to a component with a frequency higher than the fundamental frequency of the AC current (I1) is improved.

According to an eighth aspect, diagnostic system (100) includes current measurement system (20) and determination part (13). The current measurement system (20) is the current measurement system according to any one of the first to seventh aspects. The current measurement system is configured to measure a current (I1) supplied to the driver device (31) of the apparatus (30) as an AC current serving as the measurement target. The determination part (13) is configured to determine the condition of the apparatus (30) based on an output of the current measurement system (20). According to the eighth aspect, sensitivity to a component with a frequency higher than the fundamental frequency of the AC current (I1) is improved.

REFERENCE MARKS IN THE DRAWINGS 10 diagnostic system
13 determination part
20 current measurement system
22 current sensor
220 measurement coil
221 core
23 shunt resistor
24 analysis part
30 apparatus
31 driver device
32 conductor
I1 AC current
V2 output voltage

The invention claimed is:

1. A current measurement system configured to measure an alternating-current (AC) current flowing through a conductor, the current measurement system comprising:
   a current sensor including a measurement coil configured to be magnetically coupled to the conductor; and
   a shunt resistor having both ends electrically connected to both ends of the measurement coil, respectively, wherein:
   the AC current comprises a fundamental component of a fundamental frequency within a measurement range of the current measurement system and one or more components other than the fundamental component within the measurement range,
   an output voltage across the both ends of the shunt resistor has a frequency characteristic, in which the output voltage increases within the measurement range as a frequency increases, and reaches a saturation point having a saturation frequency, at which the output voltage is saturated, an upper limit value of the measurement range is set to be higher than the fundamental frequency of the AC current, the measurement coil has a self-inductance L1 and a reactance R1, and the shunt resistor has a resistance R2, and values of R1, R2 and L1 are set such that the saturation frequency obtained by $(R1+R2)/(2\pi \cdot L1)$ is higher than or equal to the upper limit value.

2. The current measurement system according to claim 1, wherein a correlation between the frequency and the output voltage within the measurement range in the frequency characteristic is expressed by a straight line with a positive inclination.

3. The current measurement system according to claim 1, wherein the output voltage V2 in the frequency characteristic is expressed by a following equation:

$$V2 = \frac{k \cdot 2\pi f \cdot L1 \cdot R2}{N\sqrt{(R1+R2)^2 + (2\pi f \cdot L1)^2}} \cdot I1,$$

where I1 is the AC current,
k is a coupling coefficient between the conductor and the measurement coil,
f is the frequency, and
N is a number of turns of the measurement coil.

4. The current measurement system according to claim 1, wherein the upper limit value of the measurement range is set to be higher than or equal to ten times of the fundamental frequency of the AC current.

5. The current measurement system according to claim 1, wherein the current sensor further includes a core having a portion passing through an inside of the measurement coil.

6. The current measurement system according to claim 1, further comprising an analysis part configured to perform frequency analysis on the output voltage on time basis to acquire data of the one or more components other than the fundamental component of the AC current.

7. A diagnostic system configured to diagnose a driver device configured to drive an apparatus, the diagnostic system comprising:
the current measurement system according to claim 1; and
a determination part configured to determine a condition of the apparatus based on an output of the current measurement system, wherein the driver device receives the AC current to drive the apparatus.

8. The current measurement system according to claim 3, wherein the saturation frequency is 10000 Hz or more.

9. A diagnostic method using a diagnostic system configured to diagnose a driver device configured to drive an apparatus, wherein the diagnostic system comprises:
a current measurement system configured to measure an alternating-current (AC) current flowing through a conductor, the current measurement system comprising:
a current sensor including a measurement coil configured to be magnetically coupled to the conductor; and
a shunt resistor having both ends electrically connected to both ends of the measurement coil, respectively, wherein:
the AC current comprises a fundamental component of a fundamental frequency within a measurement range of the current measurement system and one or more components other than the fundamental component within the measurement range, an output voltage across the both ends of the shunt resistor has a frequency characteristic, in which the output voltage increases within the measurement range as a frequency increases, and reaches a saturation point having a saturation frequency, at which the output voltage is saturated, an upper limit value of the measurement range is higher than the fundamental frequency of the AC current,
the saturation frequency is set to be higher than or equal to the upper limit value; and
a determination part configured to determine a condition of the apparatus based on an output of the current measurement system, wherein the driver device receives the AC current to drive the apparatus,
the diagnostic method comprising:
determining the measurement range based on the fundamental frequency of the AC current;
setting values of a self-inductance of the measurement coil, a reactance of the measurement coil and the resistance of the shunt resistor such that the saturation frequency is higher than or equal to the upper limit value of the measurement range;
flowing the AC current with the fundamental frequency through the conductor;
measuring, by the current measuring system, the output voltage; and
determining the condition of the apparatus by the determination part.

10. The current measurement system according to claim 6, wherein the one or more components includes one or more harmonic components of one or more harmonic frequencies of the AC current.

11. A current measurement method using a current measurement system configured to measure an alternating-current (AC) current flowing through a conductor, the current measurement system comprising:
a current sensor including a measurement coil configured to be magnetically coupled to the conductor; and
a shunt resistor having both ends electrically connected to both ends of the measurement coil, respectively, wherein:
the AC current comprises a fundamental component of a fundamental frequency within a measurement range of the current measurement system and one or more components other than the fundamental component within the measurement range,
an output voltage across the both ends of the shunt resistor has a frequency characteristic, in which the output voltage increases within the measurement range as a frequency increases, and reaches a saturation point having a saturation frequency, at which the output voltage is saturated,
an upper limit value of the measurement range is set to be higher than the fundamental frequency of the AC current,
the saturation frequency is set to be higher than or equal to the upper limit value, and
a self-inductance of the measurement coil, a reactance of the measurement coil, and a resistance of the shunt resistor satisfy a condition that the saturation frequency is higher than or equal to the upper limit value of the measurement range, the current measurement method comprising:

flowing the AC current with the fundamental frequency through the conductor; and measuring, by the current measuring system, the output voltage only within a range of the frequency characteristic in which the output voltage increases as the frequency increases below the saturation frequency.

12. The diagnostic method according to claim 9, wherein in the measuring, by the current measuring system, the output voltage comprises measuring, by the current measuring system, the output voltage only within the measurement range.

13. The diagnostic method according to claim 9, wherein the upper limit value of the measurement range is set to be higher than or equal to ten times of the fundamental frequency of the AC current.

14. The diagnostic method according to claim 9, wherein the saturation frequency is obtained by $(R1+R2)/(2\pi \cdot L1)$, where L1 is the self-inductance of the measurement coil, R1 is the reactance of the measurement coil, R2 is the resistance of the shunt resistor.

15. The current measurement method according to claim 11, wherein the upper limit value of the measurement range is set to be higher than or equal to ten times of the fundamental frequency of the AC current.

16. The current measurement method according to claim 11, wherein the saturation frequency is obtained by $(R1+R2)/(2\pi \cdot L1)$, where L1 is the self-inductance of the measurement coil, R1 is the reactance of the measurement coil, R2 is the resistance of the shunt resistor.

\* \* \* \* \*